United States Patent [19]
Katayama et al.

[11] Patent Number: 5,529,632
[45] Date of Patent: Jun. 25, 1996

[54] MICROWAVE PLASMA PROCESSING SYSTEM

[75] Inventors: Katsuo Katayama; Kyoichi Komachi; Hiroshi Mabuchi, all of Osaka; Takeshi Akimoto, Tokyo, all of Japan

[73] Assignees: Sumitomo Metal Industries, Ltd., Osaka; NEC Corporation, Tokyo, both of Japan

[21] Appl. No.: 490,087

[22] Filed: Jun. 13, 1995

[30] Foreign Application Priority Data

Jun. 14, 1994 [JP] Japan .................................. 6-132034

[51] Int. Cl.⁶ .................................................. C23C 16/00
[52] U.S. Cl. ........................... 118/723 MP; 118/723 MW; 118/723 E; 156/345; 204/298.38
[58] Field of Search ..................... 118/723 MP, 723 ME, 118/723 MW, 723 E, 723 ER; 156/345; 204/298.38; 315/111.21; 313/231.31

[56] References Cited

U.S. PATENT DOCUMENTS

| | | | |
|---|---|---|---|
| 4,985,109 | 1/1991 | Otsubo et al. | 156/345 |
| 5,173,641 | 12/1992 | Imahashi et al. | 315/111.41 |
| 5,182,495 | 1/1993 | Fukuda et al. | 315/111.41 |
| 5,364,519 | 11/1994 | Fujimura et al. | 204/298.38 |
| 5,415,719 | 5/1995 | Akimoto | 156/345 |
| 5,449,411 | 9/1995 | Fukuda et al. | 118/723 MP |

FOREIGN PATENT DOCUMENTS

| | | |
|---|---|---|
| 0379828 | 8/1990 | European Pat. Off. . |
| 57-23228 | 2/1982 | Japan . |

*Primary Examiner*—R. Bruce Breneman
*Assistant Examiner*—Joni Y. Chang
*Attorney, Agent, or Firm*—Burns, Doane, Swecker & Mathis

[57] ABSTRACT

A microwave plasma processing system has heating means for heating the wall of a reaction chamber, and an adhesion preventing member in which a cylinder disposed so as to be in contact with the inner face of a wall of the reaction chamber and a microwave reflecting plate having a gas discharge hole are integrally formed.

A microwave plasma processing system has heating means for heating the wall of a reaction chamber, and a microwave reflecting plate which is attached to the inner face of a wall of the reaction chamber and which has a gas discharge hole.

6 Claims, 8 Drawing Sheets

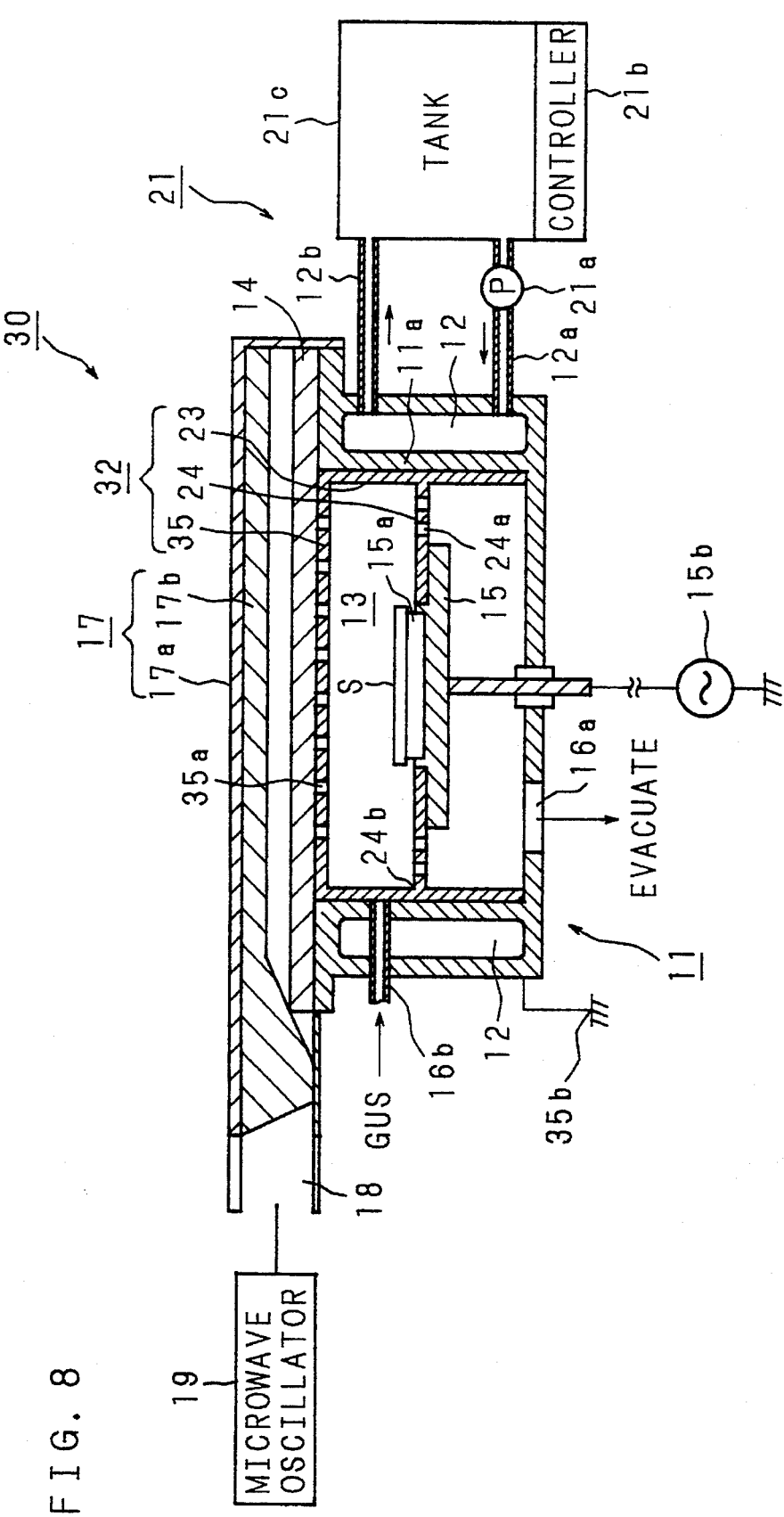

MICROWAVE PLASMA PROCESSING SYSTEM

BACKGROUND OF THE INVENTION

1. Field of the Invention

The invention relates to a microwave plasma processing system which performs a processing such as etching, ashing, or thin film formation in a production of a semiconductor device.

2. Description of Related Art

In a plasma processing system, a gas discharge is performed in a vacuum vessel under a reduced pressure or a low gas pressure by introducing microwaves into the vessel, thereby generating a plasma, and the surface of a substrate which is a sample is irradiated with the generated plasma so that a processing such as etching, or thin film formation is conducted on the substrate. Since such a plasma processing system is essential for the production of a highly integrated semiconductor element or the like, research and development thereof are intensively conducted. Particularly, a microwave plasma processing system in which the generation of a plasma and the acceleration of ions in the generated plasma can be controlled independently is desired in the dry etching technique and the burying technique for thin film formation.

FIG. 1 shows a conventional microwave plasma processing system proposed by the applicant of the present application in Japanese Patent Application Laid-Open No. 5-144773(1993). The system is aimed at independently controlling the generation of a plasma and the acceleration of ions in the plasma. In the figure, numeral 11 designates a reactor which is made of a metal such as aluminum (Al), or a stainless steel. The reactor 11 is airtightly partitioned by a microwave introduction window 14. The window 14 consists of a refractory plate made of a material such as quartz glass, or $Al_2O_3$ which allows microwaves to be transmitted therethrough, produces a small dielectric loss and has heat resistance.

In the upper portion of the reactor 11 which is partitioned by the microwave introduction window 14, disposed is a dielectric passage 17 which opposes the microwave introduction window 14 with a predetermined distance therebetween and has a size sufficient for covering the microwave introduction window 14. The dielectric passage 17 comprises a dielectric layer 17b which is made of a dielectric material producing a small dielectric loss, such as fluororesin, polystyrene, or polyethylene, and a cover 17a which is made of Al or the like and disposed on the upper face of the dielectric layer 17b. Microwaves are introduced from a microwave oscillator 19 into the dielectric passage 17 via a waveguide 18.

In the lower portion which is partitioned by the microwave introduction window 14, a reaction chamber 13 is formed. A sample stage 15 having a sample holder 15a for holding a sample S which is to be processed is disposed inside the reaction chamber 13. A high frequency power source 15b for generating a bias voltage at the surface of the sample S is connected to the sample holder 15a. The sample holder 15a is provided with a suction mechanism for sucking the sample S due to an electrostatic chuck, and a cooling mechanism for cooling the sample S due to a circulating coolant or the like.

The side wall of the reaction chamber 13 has a double-wall structure so that a flow path 12 serving as a passage for cooling water is formed inside the double-structured side wall. An inlet pipe 12a, and an outlet pipe 12b are communicated with the flow path 12. A gas supply pipe 16b through which gasses required for generating a plasma are supplied into the reaction chamber 13 is connected to the upper portion of the side wall. A gas discharge port 16a which is connected to an evacuating apparatus and through which the reaction chamber 13 (reactor 11) is evacuated to attain a vacuum is disposed in the lower wall of the reaction chamber 13.

The reactor 11, the microwave introduction window 14, the sample holder 15a, the dielectric passage 17, and so on constitute the microwave plasma processing system 10. The plasma processing area can be varied by changing the horizontal section areas of the microwave introduction window 14, and the dielectric passage 17.

Hereinafter, the case where a processing, for example, an etching is to be conducted on the surface of the sample S in the thus configured microwave plasma processing system 10 will be described.

At first, evacuation is conducted through the gas discharge port 16a to set the interior of the reaction chamber 13 to have a predetermined pressure, and reactant gasses are then supplied through the gas supply pipe 16b. Cooling water is supplied through the cooling water inlet pipe 12a to be circulated in the flow path 12, and then discharged into the cooling water outlet pipe 12b. Then the microwave oscillator 19 oscillates microwaves and the generated microwaves are introduced into the dielectric passage 17 via the waveguide 18 so that an electric field is generated below the dielectric passage 17. The generated electric field is transmitted through the microwave introduction window 14 so that a plasma is generated in the reaction chamber 13. At the same time, in order to control the anisotropy and the acceleration energy of ions in the plasma, the high frequency power source 15b applies a high frequency electric field to the sample holder 15a on which the sample S is mounted, so that a bias voltage is generated at the surface of the sample S. The bias voltage causes the ions to be perpendicularly incident upon the sample S and controls the energy of the ions incident upon the sample S, thereby conducting the etch processing or the like on the sample S.

Although, a system is proposed which is configured so that, in the microwave plasma processing system 10, an electrode made of, for example, an Al plate is in contact with the lower face of the microwave introduction window 14, or disposed at a predetermined position at the midpoint between the microwave introduction window 14 and the sample holder 15a (Japanese Patent Application Laid-Open No. 6-104098(1994)). Through holes through which the microwave is to be transmitted are formed in the electrode, and the electrode is grounded. The plasma potential generated when a high frequency electric field or a DC electric field is applied to the sample holder 15a is stabilized. Therefore, a stable bias voltage is generated at the surface of the sample S so that the directivity and the acceleration energy of ions in the plasma are further optimized.

Recently, such a method is proposed in which the side wall of the reaction chamber 13 is heated so that reaction products or decomposition products (hereinafter, referred to merely as "products") produced by the discharge energy of a plasma are suppressed from adhering to the side wall of the reaction chamber 13, thereby increasing the density of products in the vicinity of the surface of the sample S (Japanese Patent Application Laid-Open No. 4-256316(1992)). According to the method, in a process of etching a silicon oxide ($SiO_2$) film, the $SiO_2$ film can be etched away with a high selectivity with respect to the ground silicon (poly-Si) film.

However, the microwave plasma processing system 10 has a problem in that, even when the side wall of the reaction chamber 13 is heated, products easily adhere the side wall of the reaction chamber 13 little by little to form a deposition film, the deposition film flakes off as particles, and the particles adhere the surface of the sample S, whereby the plasma processing is adversely affected. In order to prevent such particles from being produced, the deposition film is removed away by cleaning using an oxygen plasma. However, this dry cleaning step requires much labor and produces a problem in that the efficiency of the plasma processing is lowered. Furthermore, there is a problem in that, when wafers serving as the sample S are successively subjected to a plasma processing one by one, the selectivity is gradually changed, with the result that it is difficult to always conduct an efficient plasma processing with excellent reproducibility.

SUMMARY OF THE INVENTION

The invention has been conducted in order to solve the above-discussed problems. It is the primary object of the invention to provide a microwave plasma processing system which is capable of generating a plasma at a high density in a reaction chamber set in a relatively low pressure state and is capable of generating a stable bias voltage at the surface of a sample so that the directivity and the acceleration energy of ions in the plasma are further optimized, as well as which is capable of conducting an etch processing on silicon oxide with a high selectivity and of conducting continuously an efficient plasma processing on a sample with excellent reproducibility and maintenance for which can be attained easily.

The microwave plasma processing system according to the invention is characterized in that the system comprises heating means for heating and keeping maintaining a wall of a reactor to a predetermined temperature, and a adhesion preventing member in which a cylinder disposed in close proximity to the inner side of the side wall of the reactor and a reflecting plate, which has a gas discharge hole, are integrally formed, the reflecting plate being disposed at a position between the cylinder and a sample holder in a manner that the reflecting plate opposes a microwave introduction window.

In a following configuration, even when the temperature of the side wall is controlled, the temperature of the reflecting plate is hardly controlled. The configuration is: a reflecting plate aimed at increasing the energy efficiency even under a low pressure is directly supported at the inner peripheral portion by a sample stage, and the outer peripheral portion of the reflecting plate is not directly connected to the side wall of a reactor to form a gap therebetween. In the configuration the heat conduction is blocked by the gap.

According to the microwave plasma processing system of the invention, the reflecting plate enables a plasma to be generated at a high density in a reaction chamber set to be under a relatively low pressure, and the heating means heats and keeps the adhesion preventing member to have a predetermined temperature via a wall. Therefore, adhesion of products to the adhesion preventing member can be reduced. As a result, the density of products distributed in the vicinity of the surface of the sample can be increased and products can be maintained at a high density state. Therefore, a silicon oxide film can be etched away with a higher selectivity with respect to the ground silicon film, and an efficient plasma processing can be conducted on the sample continuously and with excellent reproducibility. The adhesion preventing member can prevent products from directly adhering to the wall of the reactor, and the adhesion preventing member which is currently used and on which a deposition film of products is formed can be replaced with another adhesion preventing member which has been cleaned, whereby the interior of the reaction chamber can easily be cleaned. Consequently, the availability factor of the system can be increased, and particles can be prevented from being produced.

The microwave plasma processing system according to the invention is characterized in that aforementioned the adhesion preventing member is disposed in contact with the microwave introduction window and is formed integrally with a conductor through holes. The adhesion preventing member may be disposed at the midpoint between the microwave introduction window and the sample holder.

According to the microwave plasma processing system, the reflecting plate enables a plasma to be generated at a high density in a reaction chamber set to be under a relatively low pressure. Since the conductor can generate a stable bias voltage at the surface of a sample, the directivity and the acceleration energy of ions in the plasma can be further optimized. Since the heating means can heat and keep the adhesion preventing member to have a predetermined temperature via a wall, adhesion of products to the adhesion preventing member can be reduced. As a result, the density of products distributed in the vicinity of the surface of the sample can be further increased and products can be kept at a high density state. Therefore, an $SiO_2$ film can be etched away with a higher selectivity with respect to the ground poly-Si film, and an efficient plasma processing can be conducted on the sample continuously and with excellent reproducibility. The adhesion preventing member can prevent products from directly adhering to the wall of the reactor and a face of the microwave introduction window, and the adhesion preventing member which is currently used and on which a deposition film of products is formed can be replaced with another adhesion preventing member which has been cleaned, whereby the interior of the reaction chamber can be cleaned easily and surely. Consequently, the availability factor of the system can be further increased, and particles can be further prevented from being produced.

The above and further objects and features of the invention will more fully be apparent from the following detailed description with accompanying drawings.

BRIEF DESCRIPTION OF THE DRAWINGS

FIG. 8 is a schematic section view showing a microwave plasma processing system of Embodiment 2.

DESCRIPTION OF THE PREFERRED EMBODIMENTS

Hereinafter, the invention will be described in detail with reference to the drawings showing its embodiments.

Embodiment 1

Figure 1:
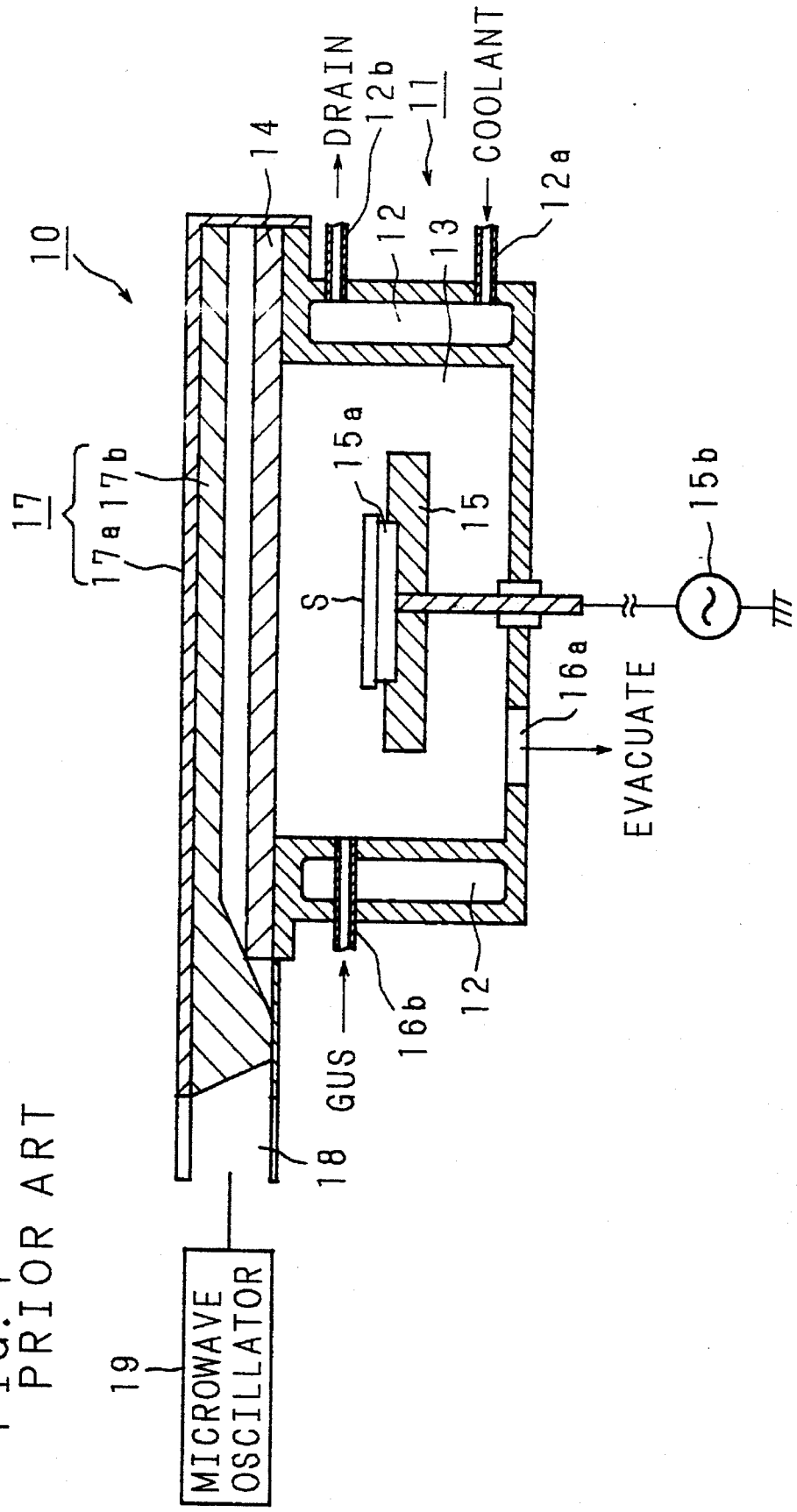
FIG. 1 is a schematic section view showing a conventional microwave plasma processing system.
Figure 2:
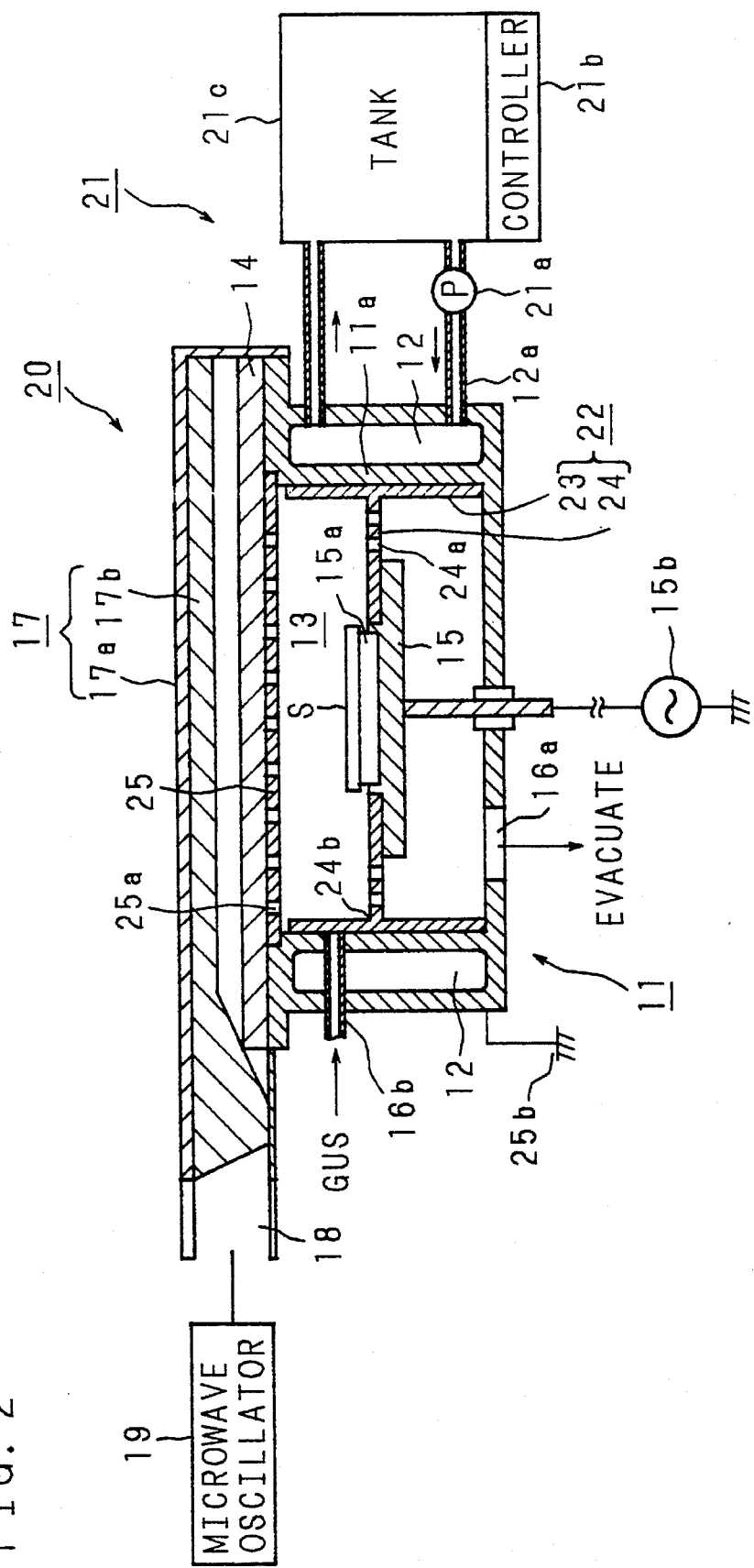
FIG. 2 is a schematic section view showing a microwave plasma processing system of Embodiment 1.

FIG. 2 is a section view schematically showing a microwave plasma processing system of Embodiment 1. In the figure, numeral 11 designates a reactor having a hollow cylindrical shape. The reactor 11 is made of a metal such as aluminum, or a stainless steel. The reactor 11 is airtightly partitioned by a microwave introduction window 14. The window 14 consists of a refractory plate made of a material such as quartz glass, or $Al_2O_3$ which allows microwaves to be transmitted therethrough, produces a small dielectric loss and has heat resistance.

In the upper portion of the reactor 11 which is partitioned by the microwave introduction window 14, disposed is a dielectric passage 17 which opposes the microwave introduction window 14 with a predetermined distance therebetween and has a size sufficient for covering the microwave introduction window 14. The dielectric passage 17 comprises a dielectric layer 17b which is made of a dielectric material producing a small dielectric loss, such as fluororesin, polystyrene, or polyethylene, and a cover 17a which is made of Al or the like and disposed on the upper face of the dielectric layer 17b. Microwaves are introduced from a microwave oscillator 19 into the dielectric passage 17 via a waveguide 18.

In the lower portion which is partitioned by the microwave introduction window 14, a reaction chamber 13 is formed. A sample stage 15 having a sample holder 15a for holding a sample S which is to be processed is disposed inside the reaction chamber 13. A high frequency power source 15b for generating a bias voltage at the surface of the sample S is connected to the sample holder 15a. The sample holder 15a is provided with a suction mechanism for sucking the sample S such as an electrostatic chuck and a cooling mechanism for cooling the sample S which uses a circulating coolant or the like.

The side wall of the reaction chamber 13 has a double-wall structure so that a flow path 12 serving as a passage for a heating medium is formed inside the double-structured side wall. An inlet pipe 12a and an outlet pipe 12b for the heating medium are connected to the lower and upper portions of the flow path 12, respectively. The inlet pipe 12a and the outlet pipe 12b are connected to a feed pump 21a, a temperature controller 21b, and a heating medium tank 21c. The flow path 12, the feed pump 21a, the temperature controller 21b, the heating medium tank 21c, and so on constitute a heating means 21. The heating medium set to have a predetermined temperature by the temperature controller 21b is circulated in the flow path 12 at a given flow rate. A gas supply pipe 16b through which gasses required for generating a plasma are supplied into the reaction chamber 13 is connected to the upper portion of the side wall. A gas discharge port 16a which is connected to an evacuating apparatus and through which the reaction chamber 13 is evacuated to attain a vacuum is disposed in the lower wall of the reaction chamber 13 (the reactor 11).

A cylinder 23 which covers the side wall 11a of the reactor 11 is disposed inside the reaction chamber 13 so as to be in close proximity to the side wall 11a. The cylinder 23 is made of, for example, Al and has a substantially cylindrical shape. A reflecting plate 24 is disposed at a position which is in the periphery of the sample holder 15a and opposes the microwave introduction window 14. The reflecting plate 24 is made of, for example, Al and has a substantially ring-like planar shape. A plurality of gas discharge holes 24a having a predetermined size are formed in the reflecting plate 24. The outer peripheral portion 24b of the reflecting plate 24 is connected to a predetermined position of the inner wall face of the cylinder 23. The cylinder 23, and the reflecting plate 24 constitute an adhesion preventing member 22. The heating means 21 heats the side wall 11a so that the cylinder 23 and the reflecting plate 24 are heated and kept to have a predetermined temperature. The heating means is not restricted to the heating means 21 using the heating medium, and may be configured so that a heater or the like directly heats the side wall 11a.

An electrode 25 which has a plurality of through holes 25a and is made of, for example, an Al plate is disposed in contact with the lower face of the microwave introduction window 14. The lower face of the electrode 25 and the upper end portion of the adhesion preventing member 22 are not connected to each other, and a gap is formed therebetween. The outer peripheral portion of the electrode 25 is supported by the upper portion of the reactor 11, and the electrode 25 is grounded via the reactor 11 (as indicated by 25b). The reactor 11, the microwave introduction window 14, the heating means 21, the adhesion preventing member 22, the electrode 25, and so on constitute a microwave plasma processing system 20.

In the thus configured microwave plasma processing system 20, for example, a process of etching the surface of the sample S mounted on the sample holder 15a is conducted in the following manner. At first, evacuation is conducted through the gas discharge port 16a. Desired reactant gasses are then introduced into the reaction chamber 13 via the gas supply pipe 16b and the interior of the reaction chamber 13 is set to have a desired pressure. The heating medium set to the predetermined temperature is circulated in the flow path 12, whereby the adhesion preventing member 22 is heated and kept to the predetermined temperature via the side wall 11a. Then the microwave oscillator 19 oscillates microwaves and the generated microwaves are introduced into the dielectric passage 17 via the waveguide 18 so that an electric field is generated below the dielectric passage 17. The generated electric field is transmitted through the microwave introduction window 14 and passes through the through holes 25a of the electrode 25, to be supplied into the reaction chamber 13 so that a plasma is generated in the chamber 13. At the same time, the high frequency power source 19 or a DC power source applies a high frequency electric field or a DC electric field to the sample holder 15a so that a bias voltage is generated at the sample S. The etch processing is conducted by irradiating the surface of the sample S with the plasma while controlling the directivity and the acceleration energy of ions in the plasma by the bias voltage.

When a deposition film is formed on the adhesion preventing member 22, the member 22 is replaced with another adhesion preventing member 22 and the plasma processing step is immediately executed. The used adhesion preventing member 22 is subjected to a wet cleaning step which is conducted as another step, thereby removing the deposition film.

Hereinafter, results of processes of conducting a plasma processing on the sample S by using the microwave plasma processing system 20 will be described. The process conditions were as follows:

Flow rates of reactant gasses
CF$_4$ 35 sccm
CHF$_3$ 35 sccm
Pressure 20 mTorr.
Microwaves
Frequency 2.45 GHz
Power 1,300 W
Heating medium
Kind Oil
Temperature 40° to 200° C.

Figure 3:
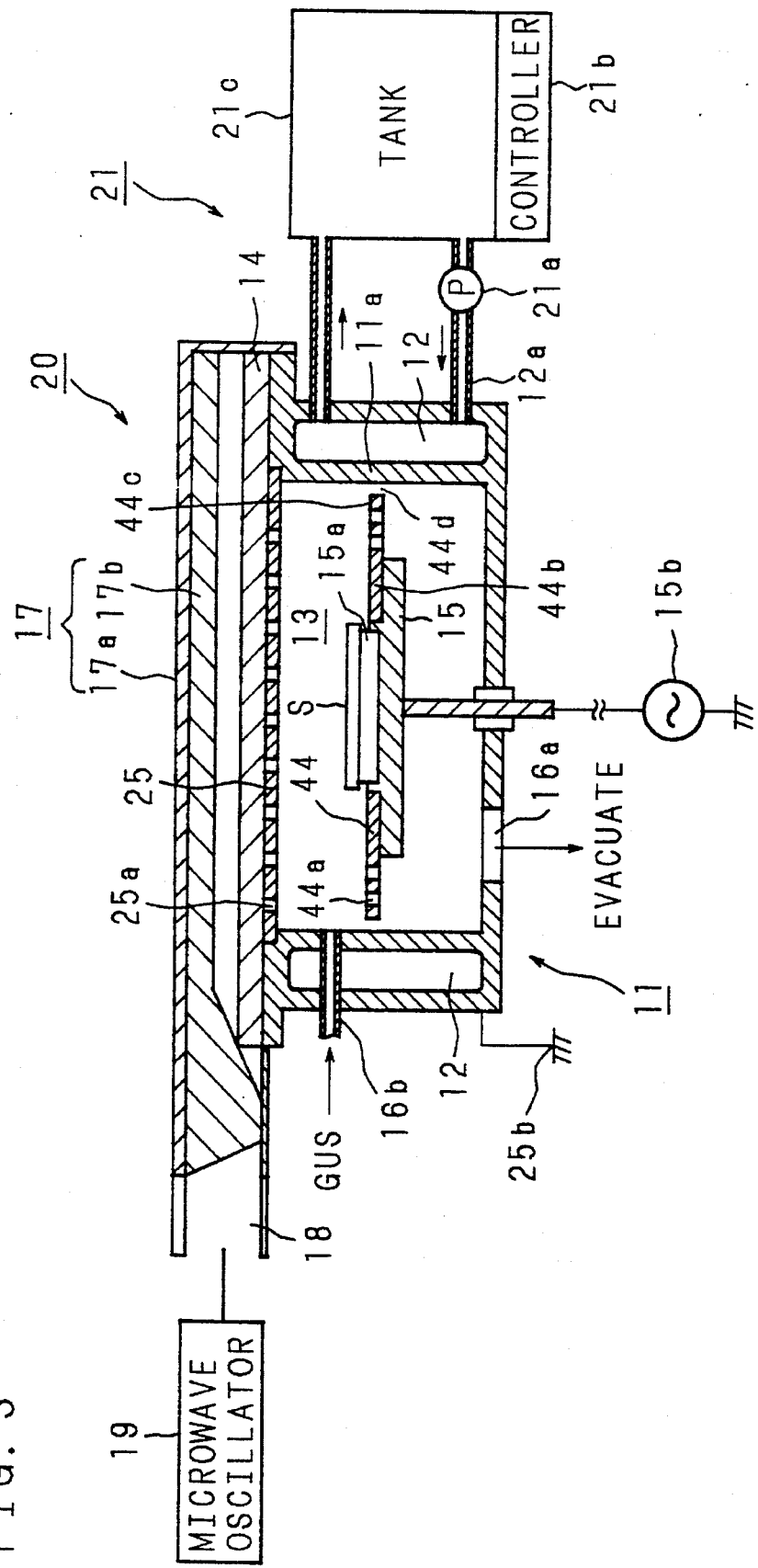
FIG. 3 is a schematic section view showing a microwave plasma processing system used a comparison example.

FIG. 3 is a schematic section view showing a system used for a comparison example. In the figure, reference symbol 15a designates a sample holder. A reflecting plate 44 is disposed at a position which is in the periphery of the sample holder 15a and opposes the microwave introduction window 14. The inner peripheral portion 44b of the reflecting plate 44 is directly supported by an upper outer portion of the sample stage 15. The outer peripheral portion 44c of the reflecting plate 44 is not connected to the side wall 11a, and a gap 44d is formed therebetween. The reflecting plate 44 is made of, for example, Al and has a substantially ring-like planar shape. A plurality of gas discharge holes 44a having a predetermined size are formed in the reflecting plate 44. The other components are configured in the same manner as those of the system shown in FIG. 2 except that the cylinder 23 is not disposed. The reactor 11, the microwave introduction window 14, the heating means 21, the reflecting plate 44, the electrode 25, etc. constitute the system used for the comparison example.

Figure 4:
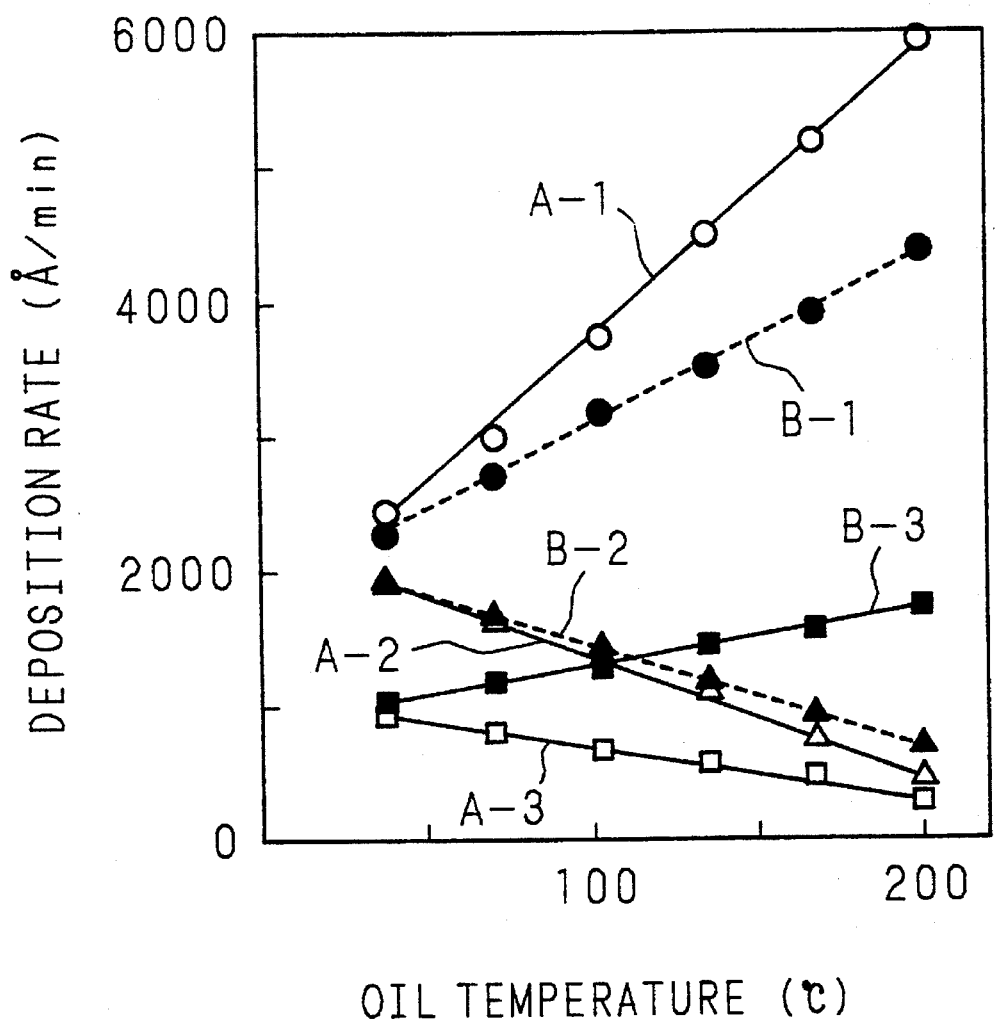
FIG. 4 is a graph showing relationships between the oil temperature and the deposition rate in the system of the invention and that of the comparison example.

FIG. 4 is a graph showing results of investigation on relationships between the deposition rate of a product film formed at various portions inside the systems and the temperature of the heating medium, when the reactant gasses were caused to be discharged by using only microwaves. The line A indicates the case where the system of Embodiment 1 was used, and the line B the case where the system of the comparison example was used. The numerals 1, 2, and 3 affixed to the lines indicate measuring positions, i.e., the sample S, the cylinder 23 or the side wall 11a, and the reflecting plate 24 or 44, respectively.

As seen from FIG. 4, in the case where the system of the comparison example was used, the deposition rate at the side wall 11a is gradually reduced (B-2) as the temperature of the heating medium is raised, and the deposition rates at the reflecting plate 44 and the sample S are gradually increased (B-1 and B-3). By contrast, in the case where the system of Embodiment 1 was used, the deposition rates at the cylinder 23 and the reflecting plate 24 are gradually reduced (A-2 and A-3) as the temperature of the heating medium is raised, and the deposition rate at the sample S is gradually increased (A-1). Moreover, the deposition rate at the sample S in the case where the system of Embodiment 1 was used (A-1) is considerably greater than that in the case where the system of the comparison example was used (B-1). In other words, when the side wall 11a is heated to a predetermined temperature by the heating medium, it is difficult for products to deposit on the side wall 11a or the cylinder 23 so that the density of products in the reaction chamber 13 is raised. In case of the system of the comparison example, however, the heat conduction to the reflecting plate 44 is so slow that the reflecting plate 44 is hardly set to be at a predetermined temperature. Consequently, products easily deposit on the reflecting plate 44, with the result that the density of products in the vicinity of the surface of the sample S is relatively low. By contrast, in case of the system of Embodiment 1, the heat conduction to the reflecting plate 24 is so rapid that the reflecting plate 24 is easily set to a predetermined temperature. Consequently, products hardly deposit on the reflecting plate 24, with the result that the density of products in the vicinity of the surface of the sample S is relatively high.

Etch processings were conducted on a silicon oxide (SiO$_2$) film and a polycrystalline silicon (poly-Si) film formed on a 6-inch Si wafer serving as the sample S under the conditions listed above while applying a high frequency electric power (800 W) of a frequency of 400 kHz to the sample holder 15a. Next, results of investigation on relationships between the temperature of the heating medium and the etch selectivity (the ratio of the etch rate of the SiO$_2$ film to that of the poly-Si film) obtained from the etch rates of the SiO$_2$ film and the poly-Si film will be described.

Figure 5:
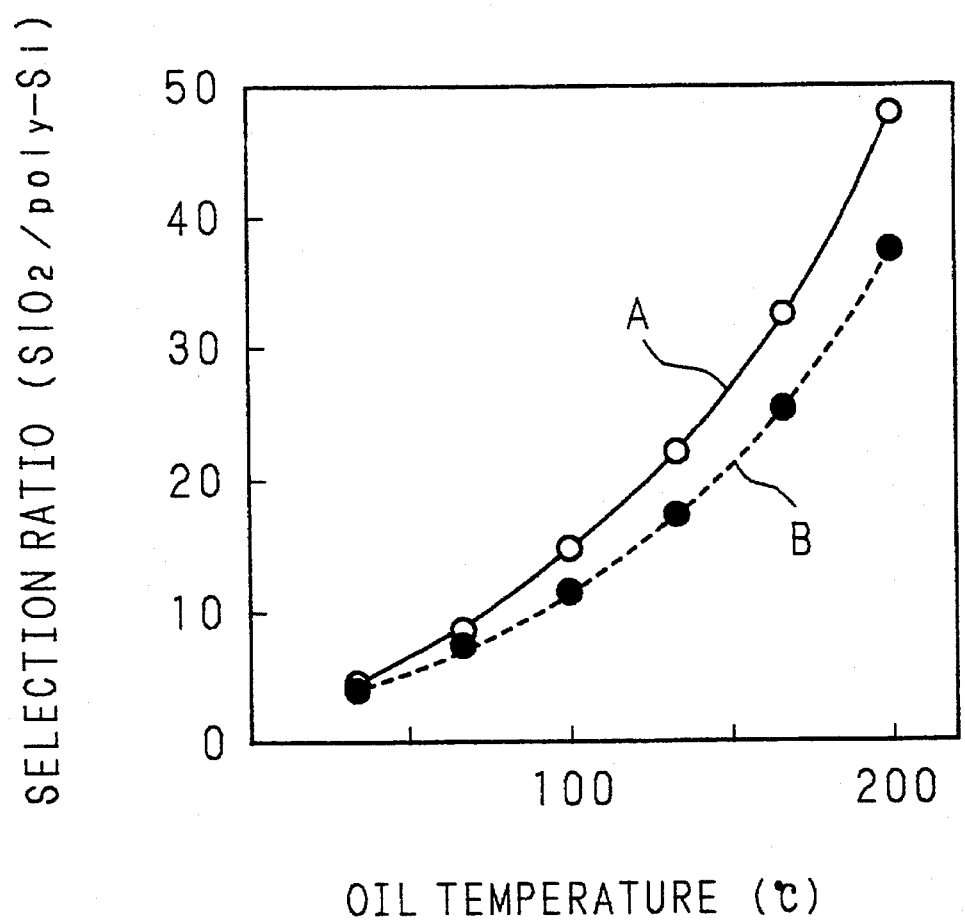
FIG. 5 is a graph showing relationships between the oil temperature and the etch selectivity in the system of the invention and that of the comparison example.

FIG. 5 is a graph showing results of investigation on the influence of the temperature of the heating medium on the etch selectivity. In the figure, reference symbol A indicates the case where the system of Embodiment 1 was used, and symbol B indicates the case where the system of the comparison example was used. As seen from FIG. 5, as the heating of the side wall 11a by means of the heating medium (oil) proceeds, the etch selectivity is increased. At all temperatures, the etch selectivity attained by the system of Embodiment 1 in which the adhesion preventing member 22 is disposed is higher than that attained by the system of the comparison example.

Next, results of processings will be described in which 100-% overetching that is more intensive than 50-% overetching conducted in a usual processing was conducted under the above-listed conditions on the sample S wherein an SiO$_2$ film is formed on a poly-Si film and further a photoresist film having a hole pattern of a diameter of about 2 μm is formed on the SiO$_2$ film.

Figure 6A:
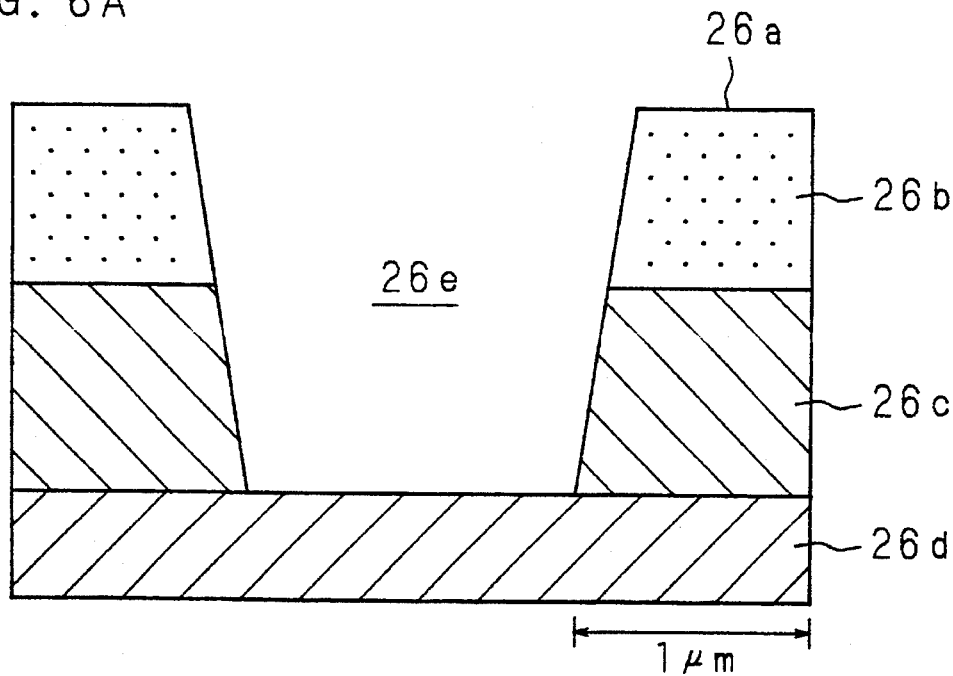
FIG. 6A is an explanatory diagram showing an etching result according to the system of the invention.
Figure 6B:
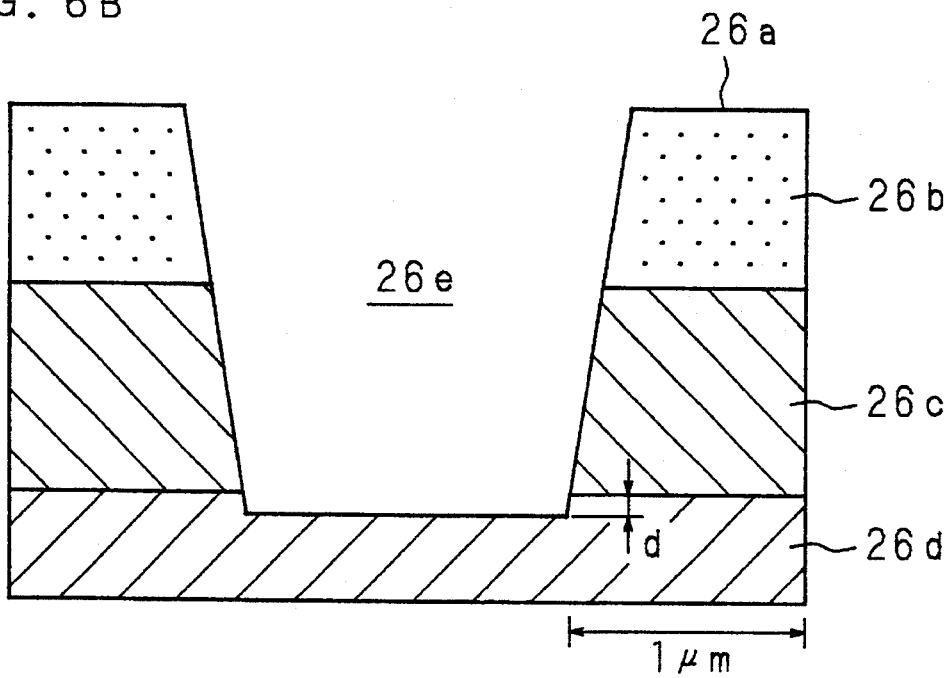
FIG. 6B is an explanatory diagram showing an etching result according to the system of the comparison example.

FIGS. 6A and 6B are diagrams which are roughly drawn to show a section in the vicinity of the surface of the etch-processed sample S under a SEM (Scanning Electron Microscope). FIG. 6A indicates the case where the system of Embodiment 1 was used, and FIG. 6B indicates the case where the system of the comparison example was used. In the sample S, an SiO$_2$ film 26c is formed on a poly-Si film 26d, and a photoresist film 26b having the above-mentioned hole pattern is formed on the SiO$_2$ film 26c. In the figures, numeral 26a designates the surface of the sample S. An etch processing was conducted on the sample S to form a hole 26e. As seen from FIGS. 6A and 6B, in case of the system of the comparison example, the ground poly-Si film 26d was etched away by a depth d (FIG. 6B), and, in case of the system of Embodiment 1, etching was stopped approximately at the interface between the poly-Si film 26d and the SiO$_2$ film 26c (FIG. 6A).

Wafers serving as the sample S were successively subjected to an etch processing one by one under the conditions listed above. Results of investigations on the etch rate of each of the wafers will be described.

Figure 7:
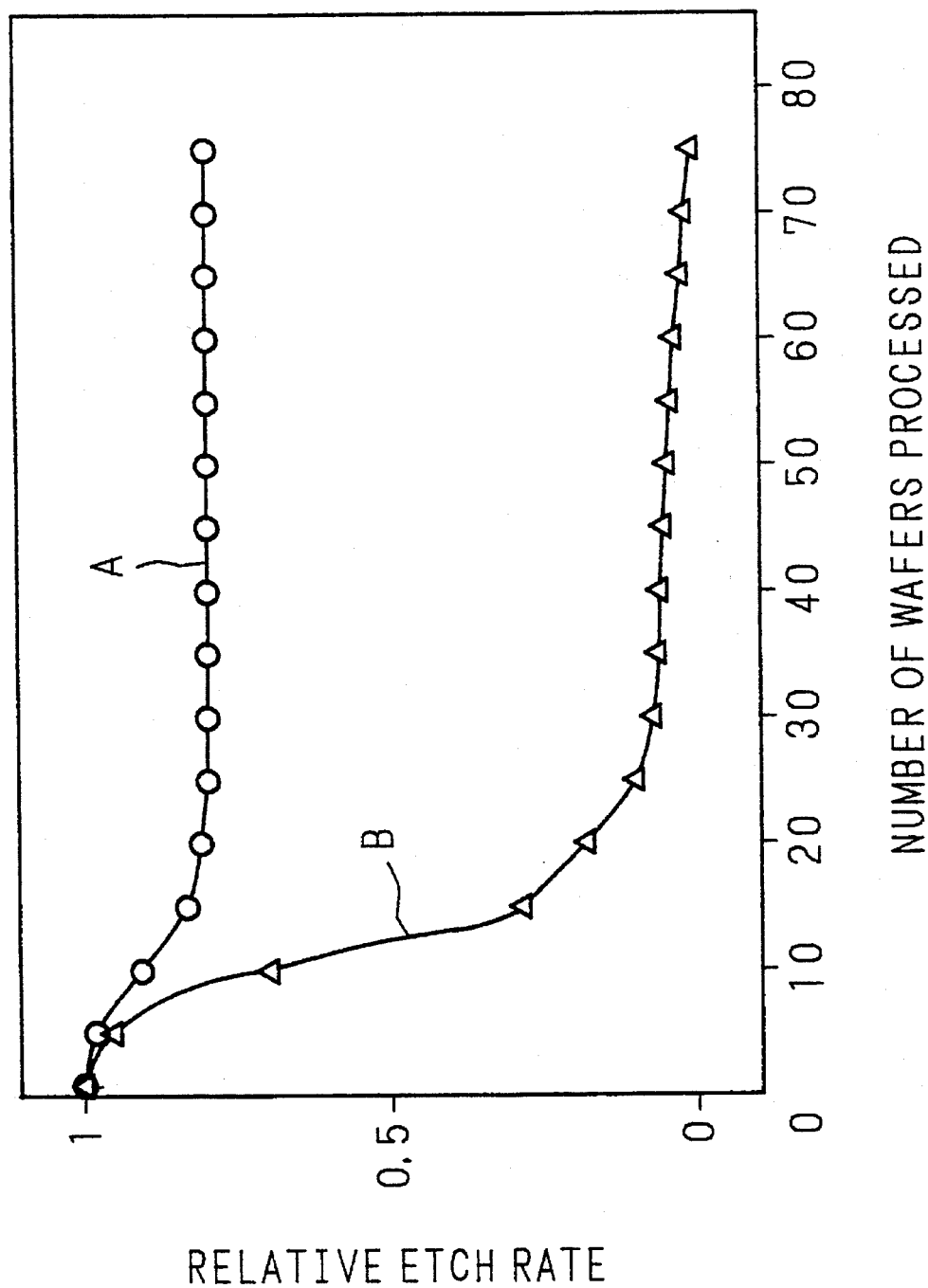
FIG. 7 is a graph showing relationships between the number of processed wafers and the relative etch rate in the system of the invention and that of the comparison example.

FIG. 7 is a graph in which ratios (relative etch rates) of the etch rates of the second, third, ... wafers to the etch rate of the first wafer are plotted. In the figure, symbol A indicates the case where the system of Embodiment 1 was used, and symbol B indicates the case where the system of the comparison example was used. As seen from FIG. 7, in case of the system of the comparison example, when the processing is continuously conducted, the etch rates of the second, third, ... wafers were gradually reduced as compared with the etch rate of the first wafer, and the etch processing on the 20th and subsequent wafers did not substantially proceed. By contrast, in case of the system of Embodiment 1, although the etch rates of the second, third, ... wafers were gradually reduced as compared with the etch rate of the first wafer, the etch processing on an about 20th and subsequent wafers was stably conducted at an etch rate which is about 80% of the etch rate for the first wafer.

As apparent from the results and description above, in the microwave plasma processing system related to Embodiment 1, the reflecting plate 24 enables a plasma to be generated at a high density in the reaction chamber 13 set to be under a relatively low pressure, and the heating means 21 can heat and keep the adhesion preventing member 22 to be a predetermined temperature via the side wall 11a. Therefore, adhesion of products to the adhesion preventing member 22 can be reduced. As a result, the density of products distributed in the vicinity of the surface of the sample S can be increased and the products can be kept at a high density state. Therefore, an $SiO_2$ film can be etched away with a higher selectivity with respect to the ground poly-Si film, and an efficient plasma processing can be conducted on the sample S continuously and with excellent reproducibility. The adhesion preventing member 22 can prevent products from directly adhering to the side wall 11a of the reactor 11, and the adhesion preventing member 22 which is currently used and on which a deposition film of products is formed can be replaced with another adhesion preventing member which has been cleaned, whereby the interior of the reaction chamber 13 can easily be cleaned. Consequently, the availability factor of the system can be increased as well as particles can be prevented from being produced. Furthermore, the electrode 25 can generate a stable bias voltage at the surface of the sample S. Therefore, the directivity and the acceleration energy of ions in the plasma can be further optimized.

Embodiment 2

FIG. 8 is a section view schematically showing a microwave plasma processing system of Embodiment 2. In the figure, numerals 23 and 24 designate a cylinder, and a reflecting plate which are structured in the same manner as those shown in FIG. 2, respectively. An electrode 35 which has a plurality of through holes 35a and is made of, for example, an Al plate is disposed on the cylinder 23 so as to be contact with the lower face of the microwave introduction window 14. The electrode 35 is grounded (25b) via the reactor 11. The outer peripheral portion 24b of the reflecting plate 24 is connected to a predetermined position of the inner wall face of the cylinder 23, and the upper end portion of the cylinder 23 is connected to the lower face of the outer peripheral portion of the electrode 35. The cylinder 23, the reflecting plate 24, and the electrode 35 are integrated into one body, thereby constituting an adhesion preventing member 32. The heating means 21 heats the side wall 11a so that the cylinder 23, the reflecting plate 24, and the electrode 35 are heated and kept to have a predetermined temperature. The other components are configured in the same manner as those of the system shown in FIG. 2. The reactor 11, the microwave introduction window 14, the heating means 21, the adhesion preventing member 32, the electrode 35, and so on constitute a microwave plasma processing system 30.

As apparent from the above description, in the microwave plasma processing system 30 of Embodiment 2, the reflecting plate 24 enables a plasma to be generated at a high density in the reaction chamber 13 set to be under a relatively low pressure. Furthermore, since the electrode 35 can generate a stable bias voltage at the surface of the sample S, the directivity and the acceleration energy of ions in the plasma can be further optimized. Since the heating means 21 can heat and keep the adhesion preventing member 22 to have a predetermined temperature via the side wall 11a, adhesion of products to the adhesion preventing member 32 can be reduced. As a result, the density of products distributed in the vicinity of the surface of the sample S can be further increased as well as products can be kept at a high density state. Therefore, a silicon oxide film can be etched away with a higher selectivity with respect to the ground silicon film, as well as an efficient plasma processing can be conducted on the sample S continuously and with excellent reproducibility. The adhesion preventing member 32 can prevent products from directly adhering to the side wall 11a of the reactor 11, and the lower face of the microwave introduction window 14. The adhesion preventing member 32 which is currently used and on which a deposition film of products is formed can be replaced with another adhesion preventing member which has been cleaned, whereby the interior of the reaction chamber 13 can be cleaned easily and surely. Consequently, the availability factor of the system can be increased, and particles can be prevented from being produced.

In the above, the embodiments in which the electrode 25 or 35 is disposed in contact with the lower face of the microwave introduction window 14 have been described. The electrode 25 or 35 may be disposed at the midpoint between the microwave introduction window 14 and the sample holder 15a.

In the systems of the embodiments, the material of the adhesion preventing member 22 or 32 is Al. The adhesion preventing member may be made of any material other than Al as far as the material is electrically conductive and excellent in heat conductivity.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A microwave plasma processing system comprising:

a microwave oscillator;

a reactor to which a microwave oscillated by said microwave oscillator and a reactant gas are to be introduced;

a waveguide for guiding the microwave to said reactor;

a dielectric passage formed on a face of said reactor and connected to said waveguide;

a microwave introduction window disposed so as to partition said reactor into said dielectric passage and a reaction chamber;

a sample holder disposed in said reaction chamber;

means for applying an electric field to said sample holder;

means for supplying the reactant gas to said reaction chamber;

means for controlling a wall temperature of said reaction chamber; and an adhesion preventing member in which a cylinder disposed in contact with an inner face of the wall of said reaction chamber, and a microwave reflecting plate are integrally formed, said reflecting plate perpendicularly elongating from an inner side face of said cylinder toward a periphery of said sample holder in a manner that said reflecting plate opposes said microwave introduction window, and said reflecting plate having a gas discharge hole.

2. A microwave plasma processing system according to claim 1, further comprising a conductor which is disposed between said microwave introduction window and said sample holder, and has microwave transmission holes.

3. A microwave plasma processing system according to claim 1, wherein said adhesion preventing member integrally comprises a conductor which is disposed in contact with said microwave introduction window and has microwave transmission holes.

4. A microwave plasma processing system according to claim 1, wherein said adhesion preventing member integrally comprises a conductor which is disposed at the midpoint between said microwave introduction window and said sample holder and has microwave transmission holes.

5. A microwave plasma processing system comprising:

a microwave oscillator;

a reactor to which a microwave oscillated by said microwave oscillator and a reactant gas are to be introduced;

a waveguide for guiding the microwave to said reactor;

a dielectric passage formed on a face of said reactor, and connected to said waveguide;

a microwave introduction window is disposed so as to partition said reactor into said dielectric passage and a reaction chamber;

a sample holder disposed in said reaction chamber;

means for applying an electric field to said sample holder;

means for supplying the reactant gas to said reaction chamber;

means for controlling a wall temperature of said reaction chamber; and a microwave reflecting plate which perpendicularly elongates from an inner face of the wall of said reaction chamber toward a periphery of said sample holder in a manner that said reflecting plate opposes said microwave introduction window, said reflecting plate having a gas discharge hole.

6. A microwave plasma processing system according to claim 5, further comprising a conductor which is disposed between said microwave introduction window and said sample holder and has microwave transmission holes.

* * * * *